(12) United States Patent
    Hacker (10) Patent No.: US 11,527,505 B2
(45) Date of Patent: Dec. 13, 2022

(54) UNIFORM ELECTROCHEMICAL PLATING OF METAL ONTO ARRAYS OF PILLARS HAVING DIFFERENT LATERAL DENSITIES AND RELATED TECHNOLOGY

(71) Applicant: Micron Technology, Inc., Boise, ID (US)

(72) Inventor: Jonathan S. Hacker, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 25 days.

(21) Appl. No.: 17/102,253

(22) Filed: Nov. 23, 2020

(65) Prior Publication Data

US 2021/0074663 A1    Mar. 11, 2021

Related U.S. Application Data

(63) Continuation of application No. 16/550,045, filed on Aug. 23, 2019, now Pat. No. 10,847,486, which is a continuation of application No. 15/872,845, filed on Jan. 16, 2018, now Pat. No. 10,396,052, which is a
    (Continued)

(51) Int. Cl.
    *H01L 23/00*   (2006.01)
    *H01L 25/065*  (2006.01)
    *H01L 25/00*   (2006.01)
    *G06F 30/394*  (2020.01)

(52) U.S. Cl.
    CPC .......... *H01L 24/17* (2013.01); *G06F 30/394* (2020.01); *H01L 24/11* (2013.01); *H01L 25/0657* (2013.01); *H01L 25/50* (2013.01);
    *H01L 2224/11462* (2013.01); *H01L 2224/1703* (2013.01); *H01L 2224/17177* (2013.01); *H01L 2224/17519* (2013.01)

(58) Field of Classification Search
    CPC ......... H01L 24/17; H01L 24/11; H01L 25/50; H01L 25/0657
    See application file for complete search history.

(56) References Cited

U.S. PATENT DOCUMENTS

| 7,335,995 B2 | 2/2008  | Pflughaupt et al. |
| 7,855,137 B2 | 12/2010 | Farooq et al. |
| 8,970,036 B2 | 3/2015  | Raj et al. |

(Continued)

*Primary Examiner* — Jasmine J Clark
(74) *Attorney, Agent, or Firm* — Perkins Coie LLP (57) ABSTRACT

A semiconductor die assembly in accordance with an embodiment of the present technology includes first and second semiconductor dies spaced apart from one another. The first semiconductor die has a major surface with non-overlapping first and second regions. The semiconductor die assembly further includes an array of first pillars extending heightwise from the first region of the major surface of the first semiconductor die toward the second semiconductor die. Similarly, the semiconductor die assembly includes an array of second pillars extending heightwise from the second region of the major surface of the first semiconductor die toward the second semiconductor die. The first and second pillars have different lateral densities and different average widths. The latter difference at least partially offsets an effect of the former difference on relative metal deposition rates of an electrochemical plating process used to form the first and second pillars.

8 Claims, 7 Drawing Sheets

Related U.S. Application Data continuation of application No. 15/380,877, filed on Dec. 15, 2016, now Pat. No. 9,905,527.

(56) References Cited

U.S. PATENT DOCUMENTS

| | | |
|---|---|---|
| 9,324,557 B2 | 4/2016 | Cate et al. |
| 9,564,416 B2 | 2/2017 | Hou et al. |
| 9,905,527 B1 | 2/2018 | Hacker |
| 10,396,052 B2 | 8/2019 | Hacker |
| 2005/0194695 A1 | 9/2005 | Lin et al. |
| 2015/0214175 A1* | 7/2015 | Kiyono .................. H01L 24/81 257/737 |
| 2018/0174993 A1 | 6/2018 | Hacker |

* cited by examiner

UNIFORM ELECTROCHEMICAL PLATING OF METAL ONTO ARRAYS OF PILLARS HAVING DIFFERENT LATERAL DENSITIES AND RELATED TECHNOLOGY

CROSS-REFERENCE TO RELATED APPLICATIONS

This application is a continuation of U.S. application Ser. No. 16/550,045, filed Aug. 23, 2019, now U.S. Pat. No. 10,847,486, which is a continuation of U.S. application Ser. No. 15/872,845, filed Jan. 16, 2018, now U.S. Pat. No. 10,396,052, which is a continuation of U.S. application Ser. No. 15/380,877, filed Dec. 15, 2016, now U.S. Pat. No. 9,905,527, each of which are incorporated herein by reference in their entirety.

TECHNICAL FIELD

The present technology is related to packaged semiconductor dies.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Market pressures continually drive semiconductor manufacturers to reduce the size of die packages to fit within the space constraints of electronic devices, while concurrently increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be electrically and thermally interconnected by arrays of pillars. A common approach to forming these pillars includes forming a photoresist pattern that masks portions of the die surface other than portions at which the pillars are to be formed. After the photoresist pattern is formed, metal is electrochemically plated onto the unmasked portion of the die surface. Finally, the photoresist around the newly formed pillars is removed.

A challenge associated with electrochemical plating of metal onto pillars in semiconductor die assemblies is that, in practice, the plated metal tends to be non-uniform in height among pillars throughout a given die and/or among pillars throughout a given wafer. These non-uniformities can complicate forming reliable electrical and thermal connections between neighboring dies. For example, when neighboring dies in a semiconductor die assembly are brought together during manufacturing, gaps between pillars on one of the dies and corresponding bond pads on the neighboring die may vary considerably when the pillars have variable heights and the bond pads are coplanar. In the context of electrical-interconnect pillars, when a pillar-to-bond-pad gap is too large to be bridged by solder, an entire package may inoperative and need to be scrapped. Similarly, in the context of thermal pillars, when a pillar-to-bond-pad gap is excessively large, the rate at which heat is dissipated from semiconductor dies in the package may be unacceptably low.

DETAILED DESCRIPTION

As discussed above, pillars formed by conventional electrochemical plating processes often have non-uniform heights. This undesirable property typically results from local variation in the rate of metal deposition for the electrochemical plating processes used to form the pillars. In at least some cases, differing lateral densities of pillars in different regions of a die contribute to this local variation in metal deposition rate. Depending on the chemistry, electrical properties, and/or other factors during electroplating, greater lateral densities of pillars can be associated with higher or lower local metal deposition rates and, correspondingly, greater or lesser local pillar heights. Differing lateral densities of pillars in different regions of a die may, however, be desirable for other reasons. For example, the need to prevent electrical shorts or capacitance may necessitate a minimum lateral density for electrical-interconnect pillars that does not apply to thermal pillars. Thus, thermal pillars in a semiconductor die assembly may have a greater lateral density than electrical-interconnect pillars in the same assembly. As another example, different regions of a semiconductor die may have different needs for electrical and/or thermal interconnection with a neighboring semiconductor die, thus calling for different arrays of pillars and/or different portions of a single array of pillars to have different lateral densities to meet these needs. Other examples of reasons for using differing lateral densities of pillars in the same semiconductor die assembly are also possible.

Semiconductor die assemblies and related devices, systems, and methods in accordance with embodiments of the present technology can have features that facilitate achieving relatively uniform pillar heights among and between arrays of pillars having different lateral densities (e.g., different lateral spacing between pillars in different regions). In at least some embodiments, different target widths for pillars in these arrays are selected to at least partially offset an effect of the differing lateral densities of the pillars on a metal deposition rate for an electrochemical plating process used to form the pillars. In a particular embodiment, first pillars in an array of the first pillars have a different lateral density and a different average width than a lateral density and an average width of second pillars in an array of the second pillars within the same semiconductor die assembly. In addition or alternatively, dummy pillars can be interspersed among the first pillars and/or among the second pillars. The presence, size, lateral density, etc. of dummy pillars may supplement or take the place of differing pillar width in offsetting the effect of the differing lateral pillar densities on the metal deposition rate. Other advantages over conventional counterparts in addition to or instead of the foregoing advantages also may be present. Furthermore, as described below, semiconductor die assemblies and related devices, systems, and methods in accordance with embodiments of the present technology can have features in addition to or instead of features associated with use of different widths and/or dummy pillars to offset the effect of the differing lateral densities on a metal deposition rate.

Specific details of semiconductor die assemblies and related devices, systems, and methods in accordance with several embodiments of the present technology are disclosed herein with reference to FIGS. 1-14. Although these embodiments may be disclosed herein primarily or entirely in the context of pillars that electrically and thermally interconnect neighboring semiconductor dies in a stack, other suitable contexts are within the scope of the present technology. For example, suitable features disclosed in the context of electrical-interconnect pillars and/or in the context of thermal pillars can be implemented in the context of arrays of optical-interconnect pillars or in the context of arrays of structural pillars. Furthermore, it should be understood that suitable features of the present technology disclosed in the context of array-to-array variation in lateral pillar density can be implemented in the context of within-array variation in lateral pillar density. Also, suitable features of the present technology disclosed in the context of relatively tall pillars at one side of a die can be implemented in the context of relatively short pillars (e.g., bond pads, under-bump metallization, etc.) at an opposite side of the die. In general, it should be understood that various other devices, systems, and methods in addition to those disclosed herein may be within the scope of the present technology. For example, devices, systems, and methods in accordance with embodiments of the present technology can have different and/or additional configurations, components, or procedures than those disclosed herein. Moreover, a person of ordinary skill in the art will understand that devices, systems, and methods in accordance with embodiments of the present technology can be without configurations, components, or procedures disclosed herein without deviating from the present technology.

Figure 1:
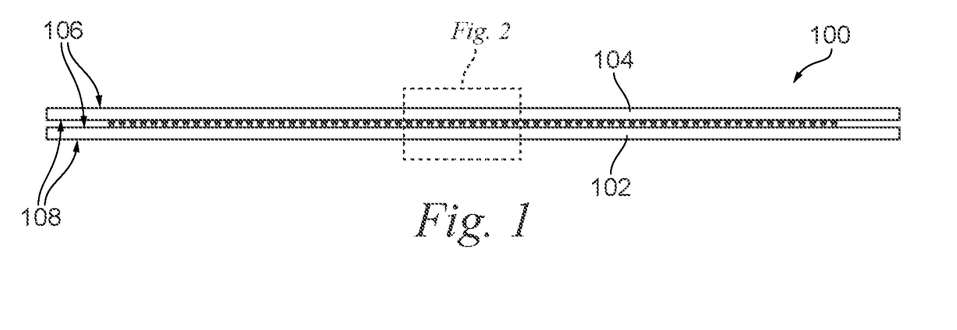
FIG. 1 is a side view of a semiconductor die assembly in accordance with an embodiment of the present technology.
Figure 2:
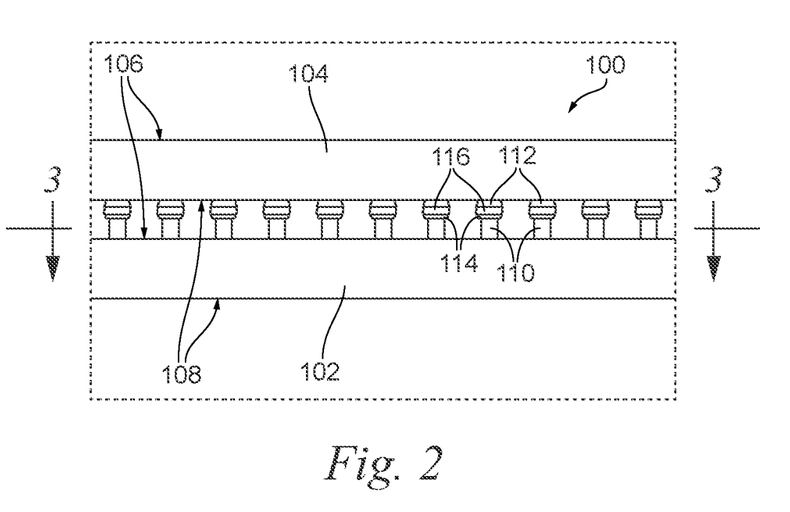
FIG. 2 is an enlarged view of a portion of FIG. 1.

FIG. 1 is a side view of a semiconductor die assembly 100 in accordance with an embodiment of the present technology, and FIG. 2 is an enlarged view of a portion of FIG. 1. With reference to FIGS. 1 and 2 together, the semiconductor die assembly 100 can include a first semiconductor die 102 and a second semiconductor die 104 spaced apart from one another. In a finished package, the first and second semiconductor dies 102, 104 can be encapsulated alone or with other semiconductor dies. In the illustrated orientation, the first and second semiconductor dies 102, 104 each have an upper major surface 106 and an opposite lower major surface 108. The first semiconductor die 102 can include laterally spaced apart electrical-interconnect pillars 110 extending heightwise toward the second semiconductor die 104. The second semiconductor die 104 can include laterally spaced apart bond pads 112 aligned with the electrical-interconnect pillars 110. For clarity of illustration, only one row of the electrical-interconnect pillars 110 and only one corresponding row of the bond pads 112 are shown in FIGS. 1 and 2.

The electrical-interconnect pillars 110 and the bond pads 112 can be electrically connected to internal circuitry (not shown) of the first and second semiconductor dies 102, 104, respectively. Individual pairs of one of the electrical-interconnect pillars 110 and a corresponding one of the bond pads 112 can be configured to form an electrical connection between the internal circuitry of the first and second semiconductor dies 102, 104. Between an individual electrical-interconnect pillar 110 and an individual bond pad 112, the semiconductor die assembly 100 can include a volume of barrier material 114 and a volume of solder 116 that together for a complete electrical connection. In the illustrated embodiment, the semiconductor die assembly 100 includes only two semiconductor dies. In other embodiments, a counterpart of the semiconductor die assembly 100 can include more than two semiconductor dies. For example, in such an embodiment, a counterpart of the first semiconductor die 102 can include bond pads at its lower major surface for electrical connection with additional underlying semiconductor dies. Similarly, a counterpart of the second semiconductor die 104 can include electrical-interconnect pillars at its upper major surface for electrical connection with additional overlying semiconductor dies. Furthermore, counterparts of the components described above for forming electrical interconnections between internal circuitry of the first and second semiconductor dies 102, 104 can instead form electrical connections to and/or between the underlying and overlying semiconductor dies.

Figure 3:
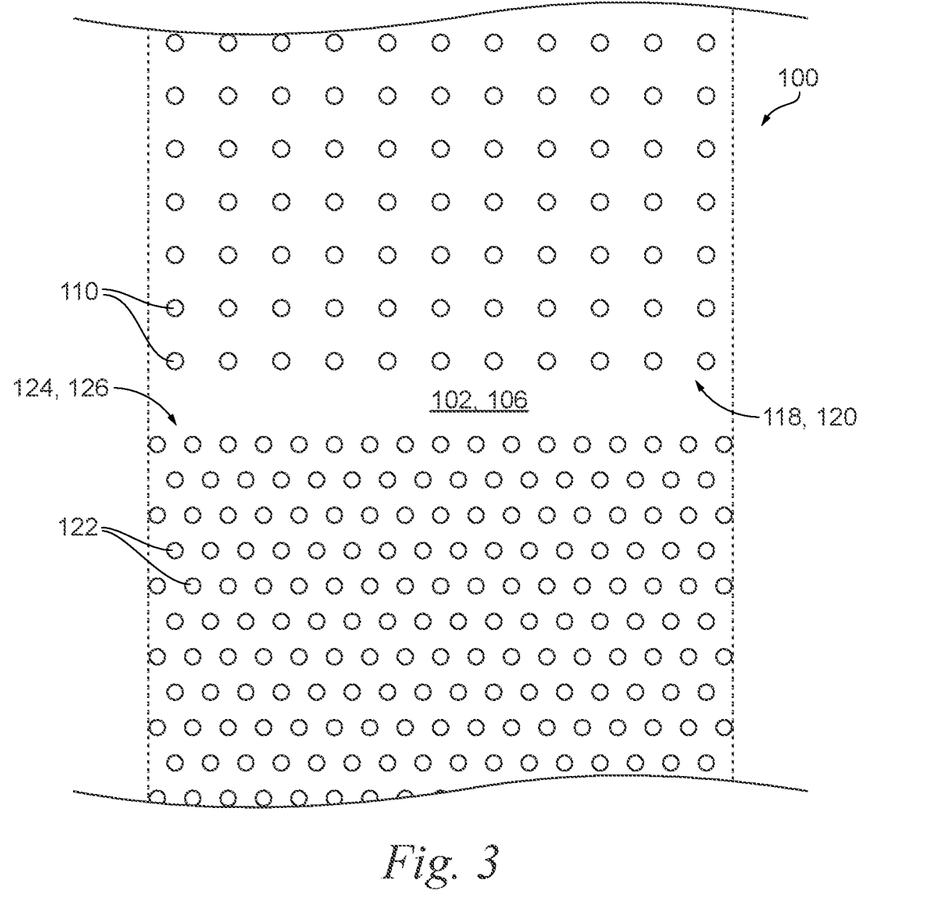
FIG. 3 is an enlarged cross-sectional view of a portion of the semiconductor die assembly of FIG. 1 corresponding to the portion shown in FIG. 2 taken along the line 3-3 in FIG. 2.

FIG. 3 is an enlarged cross-sectional view of a portion of the semiconductor die assembly 100 corresponding to the portion shown in FIG. 2 taken along the line 3-3 in FIG. 2. As shown in FIG. 3, the electrical-interconnect pillars 110 can be arranged in a first array 118 at a first region 120 of the upper major surface 106 of the first semiconductor die 102. The first semiconductor die 102 can further include thermal pillars 122 arranged in a second array 124 at a non-overlapping second region 126 of its upper major surface 106. Like the electrical-interconnect pillars 110, the thermal pillars 122 can extend heightwise toward the second semiconductor die 104 (FIG. 1). The thermal pillars 122 can be configured to conduct heat rather than electricity between the first and second semiconductor dies 102, 104. Accordingly, the thermal pillars 122 can be electrically insulated from internal circuitry of one or both of the first and second semiconductor dies 102, 104. In the illustrated embodiment, the lateral density of the electrical-interconnect pillars 110 is lower than the lateral density of the thermal pillars 122 (e.g., by at least 5% or by at least 10%), and the minimum lateral spacing between the electrical-interconnect pillars 110 is greater than the minimum lateral spacing between the thermal pillars 122 (e.g., by at least 5% or by at least 10%). In other embodiments, the lateral density of counterparts of the electrical-interconnect pillars 110 can be higher than the lateral density of counterparts of the thermal pillars 122, and the minimum lateral spacing between the counterparts of the electrical-interconnect pillars 110 can be less than the minimum lateral spacing between the counterparts of the thermal pillars 122.

Figure 4:
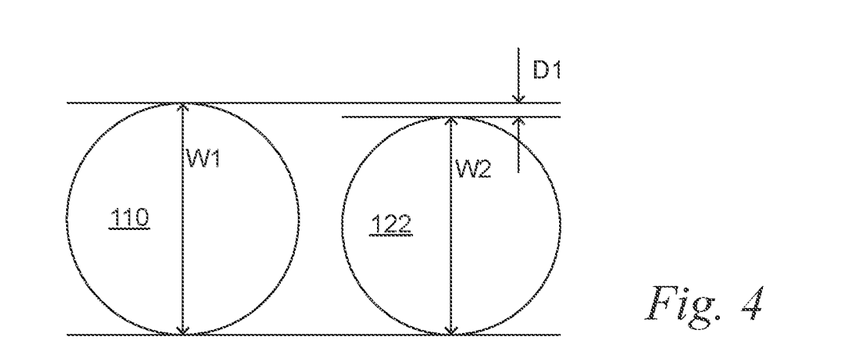
FIG. 4 is a further enlarged top plan view of two pillars of the semiconductor die assembly of FIG. 1.

FIG. 4 is a further enlarged top plan view of one of the electrical-interconnect pillars 110 and one of the thermal pillars 122 in isolation. As shown in FIG. 4, the width W1 of the illustrated electrical-interconnect pillar 110 is greater than the width W2 of the illustrated thermal pillar 122 by a difference D1. Correspondingly, an average width of the electrical-interconnect pillars 110 throughout the first array 118 can be greater than an average width of the thermal pillars 122 throughout the second array 124 (e.g., by at least 2% or by at least 5%). This difference in average width can be imparted to the electrical-interconnect pillars 110 and to the thermal pillars 122 by design. For example, for an electrochemical plating process having a metal deposition rate directly or inversely proportional to both lateral pillar density and pillar width, decreasing the width of the thermal pillars 122 relative to the width of the electrical-interconnect pillars 110 can at least partially offset a difference in final plated height due to the higher lateral pillar density of the thermal pillars 122. In this way, even though the respective lateral densities of the electrical-interconnect pillars 110 in the first array 118 and the thermal pillars 122 in the second array 124 are significantly different, the final plated height of both the electrical-interconnect pillars 110 and of the thermal pillars 122 can be approximately the same. Similarly, the bond pads 112 (not shown in FIGS. 3 and 4) corresponding to the electrical-interconnect pillars 110 in the first array 118 and the thermal pillars 122 in the second array 124 can have different average widths and similar final plated heights.

Figure 5:
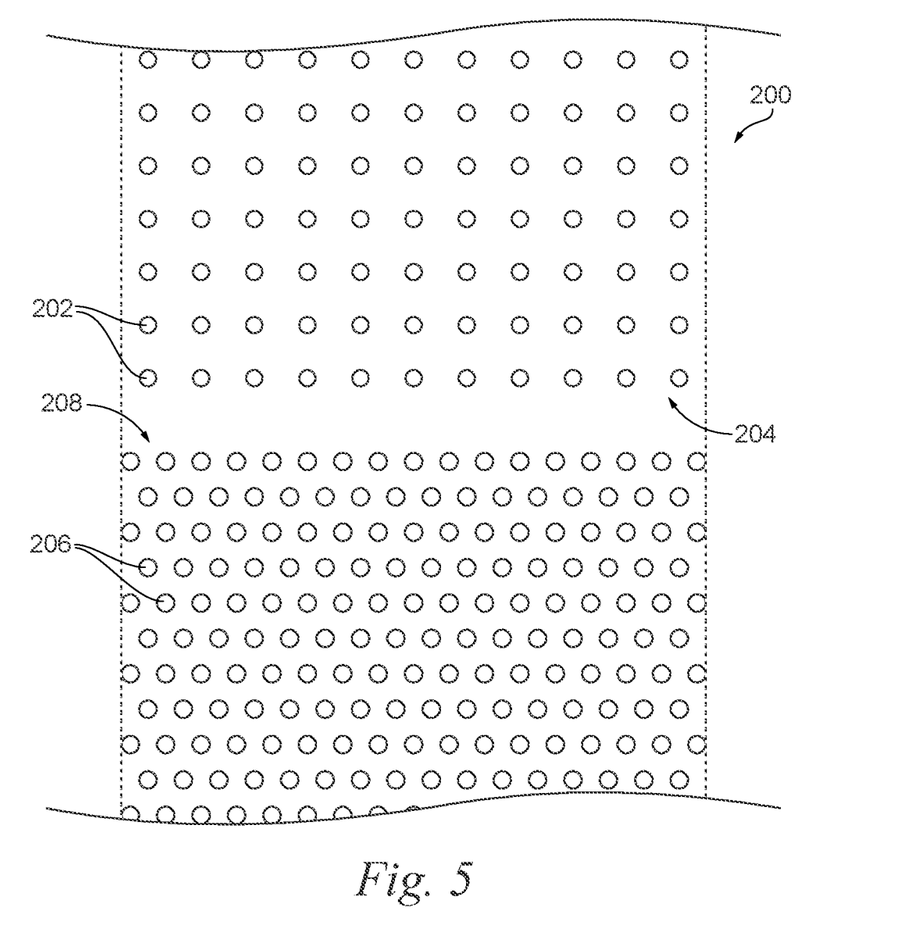
FIG. 5 is a cross-sectional view similar to FIG. 3 showing a portion of a semiconductor die assembly in accordance with another embodiment of the present technology.
Figure 6:
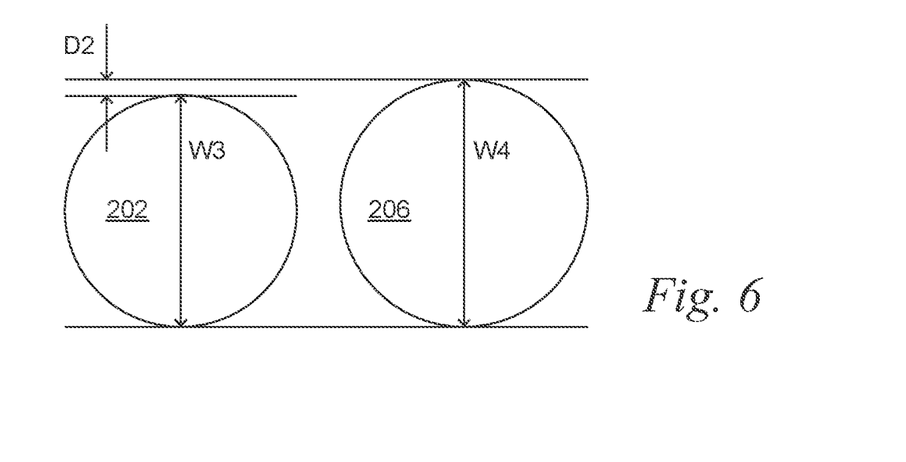
FIG. 6 is an enlarged top plan view of two pillars of the semiconductor die assembly of FIG. 5.

FIG. 5 is a cross-sectional view similar to FIG. 3 showing a portion of a semiconductor die assembly 200 in accordance with another embodiment of the present technology. As shown in FIG. 5, the semiconductor die assembly 200 can include electrical-interconnect pillars 202 arranged in a first array 204, and thermal pillars 206 arranged in a second array 208. FIG. 6 is an enlarged top plan view of one of the electrical-interconnect pillars 202 and one of the thermal pillars 206 in isolation. As shown in FIG. 6, a width W3 of the illustrated electrical-interconnect pillar 202 is less than a width W4 of the illustrated thermal pillar 122 by a difference D2. Correspondingly, an average width of the electrical-interconnect pillars 202 throughout the first array 204 can be less than an average width of the thermal pillars 206 throughout the second array 208 (e.g., by at least 2% or by at least 5%). Again, the difference in average width can be imparted to the electrical-interconnect pillars 202 and to the thermal pillars 206 by design. For example, for an electrochemical plating process having a metal deposition rate directly proportional to lateral pillar density and inversely proportional to pillar width or for an electrochemical plating process having a metal deposition rate inversely proportional to lateral pillar density and directly proportional to pillar width, increasing the width of the thermal pillars 206 relative to the width of the electrical-interconnect pillars 202 can at least partially offset a difference in final plated height due to the difference in lateral pillar densities.

Figure 7:
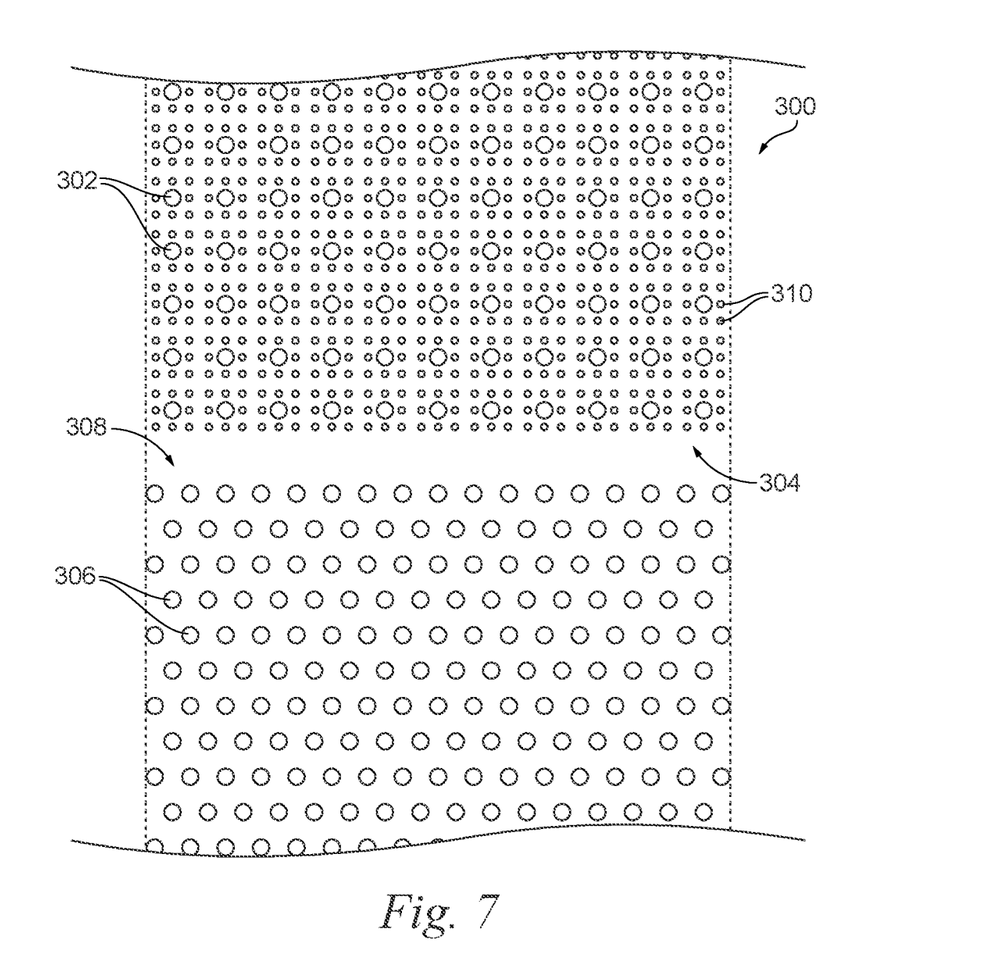
FIG. 7 is a cross-sectional view similar to FIG. 3 showing a portion of a semiconductor die assembly in accordance with another embodiment of the present technology.

FIG. 7 is a cross-sectional view similar to FIG. 3 showing a portion of a semiconductor die assembly 300 in accordance with another embodiment of the present technology. As shown in FIG. 7, the semiconductor die assembly 300 can include electrical-interconnect pillars 302 arranged in a first array 304, and thermal pillars 306 arranged in a second array 308. The semiconductor die assembly 300 can further include dummy pillars 310 interspersed among the electrical-interconnect pillars 302 within the first array 304. The dummy pillars 310 can be configured to be plated with metal by an electrochemical plating process that also plates metal onto the electrical-interconnect pillars 302. Similar to the differences in average width discussed above with reference to FIGS. 3-7, the dummy pillars 310 can at least partially offset a difference in final plated height that would otherwise occur due to the difference between the lateral density of the electrical-interconnect pillars 302 relative to the lateral density of the thermal pillars 306.

In the illustrated embodiment, the dummy pillars 310 are present within the first array 304 only. This arrangement can be useful when an electrochemical plating process used to form the electrical-interconnect pillars 302 has a metal deposition rate directly or inversely proportional to both lateral pillar density and the presence of the dummy pillars 310. In other embodiments, additional dummy pillars can be interspersed among counterparts of the thermal pillars 306 at a lesser density or coverage than the density or coverage of the dummy pillars 310 within the first array 304. In still other embodiments dummy pillars can be present within a counterpart of the second array 308 only or present within a counterpart of the second array 308 at a greater density or coverage than the density or coverage of dummy pillars within a counterpart of the first array 304. This arrangement can be useful when an electrochemical plating process used to form electrical-interconnect pillars and thermal pillars has a metal deposition rate directly proportional to lateral pillar density and inversely proportional to the presence of dummy pillars or inversely proportional to lateral pillar density and directly proportional to the presence of dummy pillars.

With reference again to FIG. 7, the dummy pillars 310 can be designed into the semiconductor die assembly 300 instead of or in addition to a difference between the average width of the electrical-interconnect pillars 302 and the average width of the thermal pillars 306. In some cases, it may be undesirable for the average width of the electrical-interconnect pillars 302 and the average width of the thermal pillars 306 to be different. In these cases, the dummy pillars 310 can be designed into the semiconductor die assembly 300 instead of such a difference in average pillar width. Thus, even though the respective lateral densities of the electrical-interconnect pillars 302 in the first array 304 and the thermal pillars 306 in the second array 308 are significantly different, and even though the average width of the electrical-interconnect pillars 302 and the average width of the thermal pillars 306 are approximately the same (e.g., differing by at most 3%), the final plated height of both the electrical-interconnect pillars 302 and the thermal pillars 306 can be approximately the same due to at least partially to the presence of the dummy pillars 310.

Figure 8:
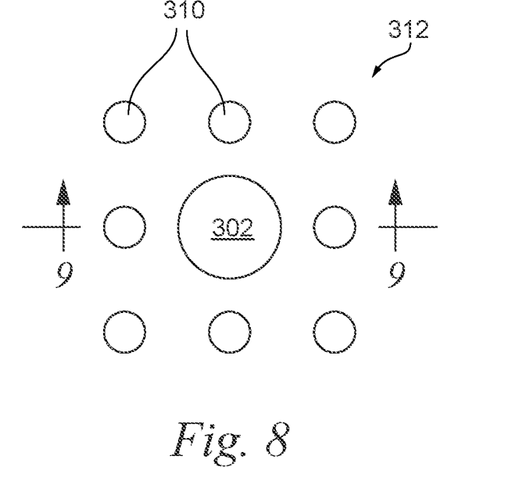
FIG. 8 is an enlarged top plan view of a cluster of pillars of the semiconductor die assembly of FIG. 7.
Figure 9:
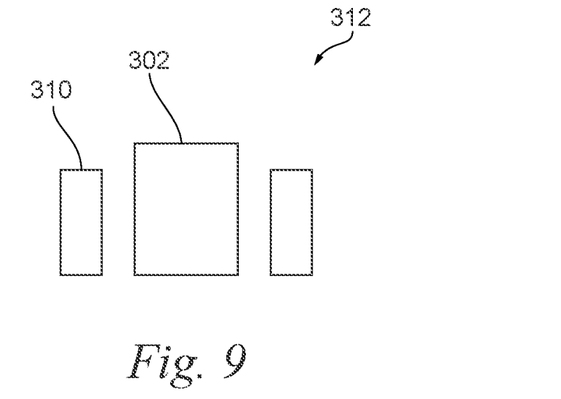
FIG. 9 is a cross-sectional view of the cluster of pillars of the semiconductor die assembly of FIG. 7 taken along the line 9-9 in FIG. 8.

The dummy pillars 310 can have various suitable arrangements, shapes, sizes, etc. For example, FIG. 8 is an enlarged top plan view of a cluster 312 that includes one of the electrical-interconnect pillars 302 and several of the dummy pillars 310 of the semiconductor die assembly 300. FIG. 9 is a cross-sectional view of the cluster 312 taken along the line 9-9 in FIG. 8. With reference to FIGS. 7-9 together, the dummy pillars 310 of the cluster 312 can be positioned at laterally spaced apart points along a path that extends around the associated electrical-interconnect pillar 302. In the illustrated embodiment, the path is square. In other embodiments, the path can be circular or another suitable shape. In at least some embodiments, the dummy pillars 310 are narrower than the electrical-interconnect pillars 302. Furthermore, as shown in FIG. 9, the dummy pillars 310 of the cluster 312 can be recessed relative to the associated electrical-interconnect pillar 302. For example, an average height of the dummy pillars 310 throughout the first array 304 can be at least 10% less than an average height of the electrical-interconnect pillars 302 throughout the first array 304. The width of the dummy pillars 310 relative to the width of the electrical-interconnect pillars 302 can be selected to cause the dummy pillars 310 to be significantly shorter than the electrical-interconnect pillars 302. Thus, when the electrical-interconnect pillars 302 are electrically connected to a planar region of an overlying semiconductor die, the dummy pillars 310 can remain spaced apart from the overlying semiconductor die. In this way, the dummy pillars 310 can advantageously remain electrically isolated from the from the overlying semiconductor die.

Figure 10:
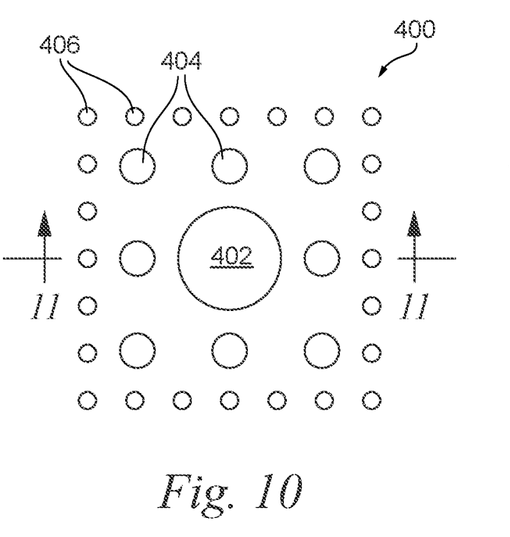
FIG. 10 is an enlarged top plan view of a cluster of pillars of a semiconductor die assembly in accordance with another embodiment of the present technology.
Figure 11:
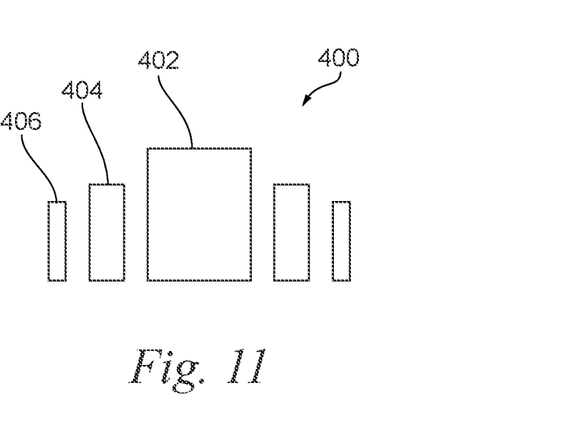
FIG. 11 is a cross-sectional view of the cluster of pillars of FIG. 10 taken along the line 11-11 in FIG. 10.

FIG. 10 is an enlarged top plan view of a cluster 400 of pillars of a semiconductor die assembly in accordance with another embodiment of the present technology. The cluster 400 can include an electrical-interconnect pillar 402, first dummy pillars 404 individually positioned at laterally spaced apart points along a path that extends around the electrical-interconnect pillar 402, and second dummy pillars 406 individually positioned at laterally spaced apart points along a path that extends around the first dummy pillars 404. The average width of the first dummy pillars 404 can be less than the width of the electrical-interconnect pillar 402, and the average width of the second dummy pillars 406 can be less than the average width of the first dummy pillars 404. FIG. 11 is a cross-sectional view of the cluster 400 taken along the line 11-11 in FIG. 10. As shown in FIG. 11, the average height of the first dummy pillars 404 can be less than the height of the electrical-interconnect pillar 402, and the average height of the second dummy pillars 406 can be less than the average height of the first dummy pillars 404. In other embodiments, the average width of counterparts of the second dummy pillars 406 can be greater than or equal to the average width of counterparts of the first dummy pillars 404. In addition or alternatively, the average height of counterparts of the second dummy pillars 406 can be greater than or equal to the average height of counterparts of the first dummy pillars 404.

Figure 12:
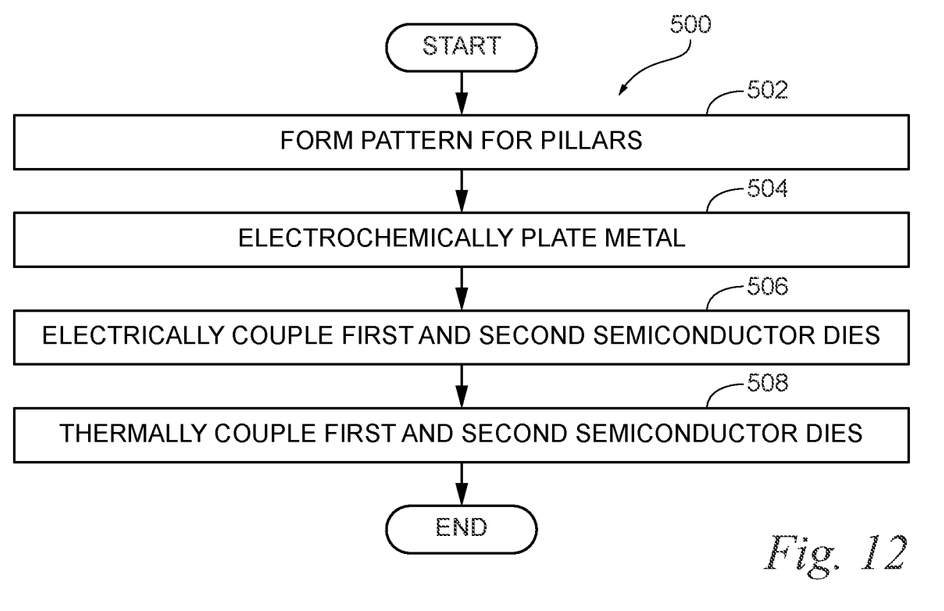
FIG. 12 is a flow chart illustrating a method for making a semiconductor die assembly in accordance with an embodiment of the present technology.

FIG. 12 is a flow chart illustrating a method 500 for making a semiconductor die assembly in accordance with an embodiment of the present technology. The method 500 can include forming patterns for arrays of pillars with different lateral densities on a die surface, such as by photolithography (block 502). Next, the method 500 can include electrochemically plating metal (e.g., copper) by an electrochemical plating process to form the pillars of the different arrays simultaneously (block 504). During the electrochemical plating process, a difference between the lateral density of first pillars within a first one of the arrays and the lateral density of second pillars within a second one of the arrays can have a first effect on relative metal deposition rates of the electrochemical plating process. Without mitigation, the first effect can cause a difference between an average plated height of the first pillars after the electrochemical plating process and an average plated height of the second pillars after the electrochemical plating process. In addition or alternatively, the first effect can cause a difference between a maximum plated height of any of the first and second pillars after the electrochemical plating process and a minimum plated height of any of the first and second pillars after the electrochemical plating process.

The first and second pillars can have different average widths and/or the first and arrays can have different densities or coverages of dummy pillars, with such differences having a second effect that at least partially offsets the difference caused by the first effect. For example, the second effect can reduce a difference between the average plated height of the first pillars after the electrochemical plating process and the average plated height of the second pillars after the electrochemical plating process that would otherwise be caused by the first effect by at least 50%. In addition or alternatively, the second effect can reduce a difference between the maximum plated height of any of the first and second pillars after the electrochemical plating process and the minimum plated height of any of the first and second pillars after the electrochemical plating process by at least 5%. After the electrochemical plating of the first and second pillars is complete, the method 500 can include electrically coupling a first semiconductor die including the first and second pillars to a second semiconductor die via one of the array of the first pillars and the array of the second pillars (block 506). The method 500 can further include thermally coupling the first semiconductor die and the second semiconductor die via the other one of the array of the first pillars and the array of the second pillars (block 508).

Figure 13:
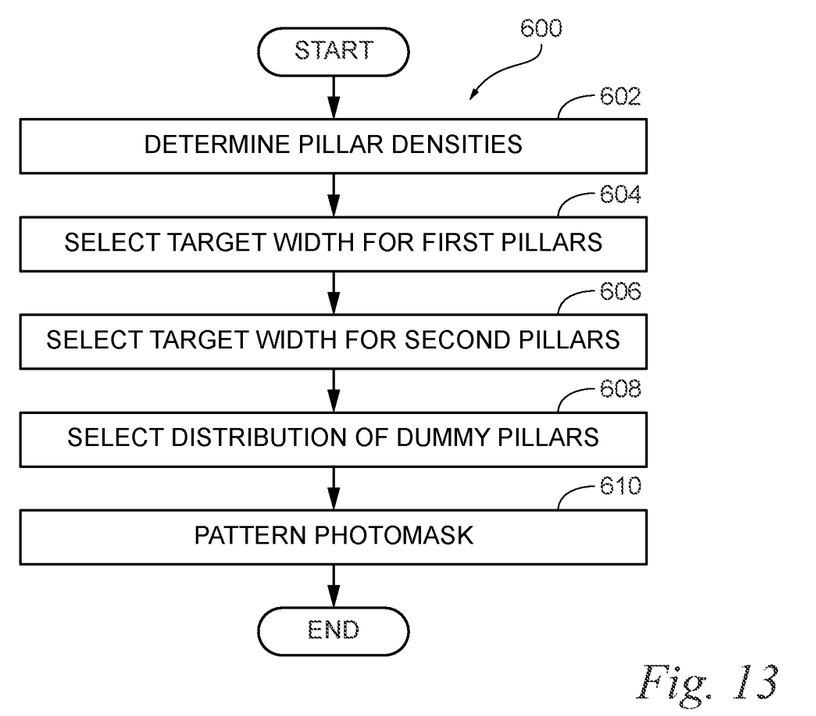
FIG. 13 is a flow chart illustrating a method for designing arrays of electrochemically plated pillars in a semiconductor die assembly in accordance with an embodiment of the present technology.

FIG. 13 is a flow chart illustrating a method 600 for designing arrays of electrochemically plated pillars in a semiconductor die assembly in accordance with an embodiment of the present technology. The method 600 can include determining the lateral densities of first and second pillars to be formed at different regions of a semiconductor die (block 602). Based at least partially on the determined lateral pillar densities, the method 600 can include selecting a target width for the first pillars (block 604) and selecting a target width for the second pillars (block 606). The target widths for the first and second pillars can be selected to be different (e.g., by at least 2% or by at least 5%), with the difference in target widths at least partially offsetting a difference in expected plated height caused by the difference in lateral pillar densities. The method 600 can further include selecting a distribution of dummy pillars (block 608) with greater density or coverage of the dummy pillars among the first pillars than among the second pillars. Like the target pillar widths, the distribution of dummy pillars can be selected to at least partially offset the difference in expected plated height caused by the difference in lateral pillar densities. The method 600 can then include patterning a photomask (block 610) that can be used to form the first and second pillars by photolithography.

Figure 14:
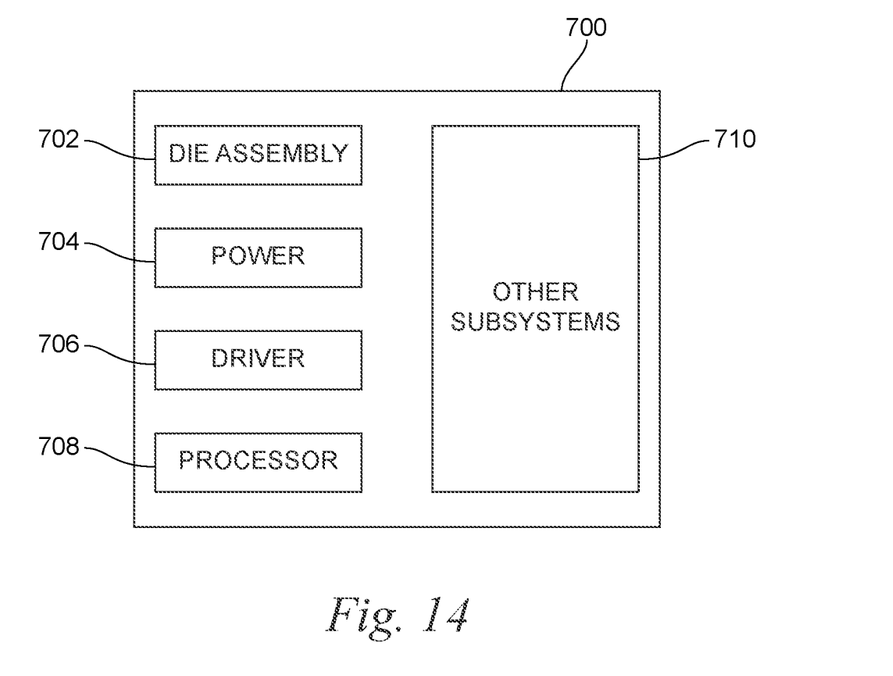
FIG. 14 is a schematic view of a system that includes a semiconductor die assembly in accordance with an embodiment of the present technology.

Any one of the semiconductor die assemblies described above with reference to FIGS. 1-13 can be incorporated into any of a myriad of larger and/or more complex systems, a representative example of which is system 700 shown schematically in FIG. 14. The system 700 can include a semiconductor die assembly 702, a power source 704, a driver 706, a processor 708, and/or other subsystems or components 710. The semiconductor die assembly 702 can include features generally similar to those of the semiconductor die assemblies described above, and can therefore include different widths and/or dummy pillars that offset the effect of differing lateral densities on metal deposition rate. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, and appliances. Components of the system 700 may be housed in a single unit or distributed over multiple, interconnected units (e.g., through a communications network). The components of the system 700 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown and/or described in detail to avoid unnecessarily obscuring the description of the embodiments of the present technology. Although steps of methods may be presented herein in a particular order, in alternative embodiments the steps may have another suitable order. Similarly, certain aspects of the present technology disclosed in the context of particular embodiments can be combined or eliminated in other embodiments. Furthermore, while advantages associated with certain embodiments may have been disclosed in the context of those embodiments, other embodiments may also exhibit such advantages, and not all embodiments need necessarily exhibit such advantages or other advantages disclosed herein to fall within the scope of the present technology.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising" and the like may be used herein to mean including at least the recited feature(s) such that any greater number of the same feature(s) and/or one or more additional types of features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not all referring to the same embodiment. Furthermore, various particular features, structures, operations, or characteristics may be combined in any suitable manner in one or more embodiments of the present technology.

I claim:

1. A method of forming pillars in a semiconductor die assembly, comprising:
   forming a first pattern of first holes and a second pattern of second holes in a material on a semiconductor die; and
   depositing a conductive material into the first holes to a first elevation relative to the surface of the material and concurrently depositing the conductive material into the second holes to a second elevation relative to the surface of the material, wherein the first elevation is different than the second elevation;
   wherein the conductive material in the first holes defines first pillars having a first height from a major surface of the semiconductor die and the conductive material in the second holes defines second pillars having a second height from the major surface of the semiconductor die, and wherein the first height is different than the second height.

2. The method of claim 1 wherein:
   each of the first holes has a first width and each of the second holes has a second width, and the first width is greater than the second width; and
   depositing the conductive material comprises concurrently electroplating the conductive material into the first holes and the second holes.

3. The method of claim 1 wherein:
   the first holes have a first lateral density and the second holes have a second lateral density, and the first lateral density is greater than the second lateral density; and
   depositing the conductive material comprises concurrently electroplating the conductive material into the first holes and the second holes.

4. The method of claim 1 wherein:
   the first holes have a first diameter and the second holes have a second diameter, and the first diameter is greater than the second diameter;
   each first hole is surrounded by a plurality of second holes; and
   depositing the conductive material comprises concurrently electroplating the conductive material into the first holes and the second holes.

5. The method of claim 1 wherein:
   the first pillars are electrical-interconnect pillars that are electrically coupled to circuitry components and the second pillars project are dummy pillars electrically isolated from the circuitry; and
   a first width of each of the electrical-interconnect pillars is greater than a second width of each of the dummy pillars.

6. The method of claim 1, further comprising:
   forming a third pattern of third holes in the material on the semiconductor die; and
   depositing the conductive material into the third holes concurrently with depositing the conductive material into the first holes and the second holes, wherein the conductive material is deposited into the third holes to a third elevation relative to the surface of the material, and the third elevation is different than first elevation and the second elevation.

7. The method of claim 1 wherein the first holes and the second holes are arranged in clusters, with each cluster having a central first hole and a plurality of second holes around the central first hole.

8. The method of claim 1, further comprising designing the first pattern of first holes to have a first lateral spacing between adjacent first holes and the second patter of second holes to have a second lateral spacing between adjacent second holes, and wherein the first average lateral spacing is greater than the second average lateral spacing.

* * * * *